(12) United States Patent
Higashi et al.

(10) Patent No.: US 9,877,417 B2
(45) Date of Patent: Jan. 23, 2018

(54) ELECTRONIC DEVICE WITH COOLING FUNCTION

(71) Applicant: TOYOTA JIDOSHA KABUSHIKI KAISHA, Toyota-shi, Aichi-ken (JP)

(72) Inventors: Yuki Higashi, Toyota (JP); Yuji Omiya, Nagakute (JP)

(73) Assignee: TOYOTA JIDOSHA KABUSHIKI KAISHA, Aichi-ken (JP)

(*) Notice: Subject to any disclaimer, the term of this patent is extended or adjusted under 35 U.S.C. 154(b) by 0 days.

(21) Appl. No.: 15/104,007

(22) PCT Filed: Dec. 15, 2014

(86) PCT No.: PCT/IB2014/002773
§ 371 (c)(1),
(2) Date: Jun. 13, 2016

(87) PCT Pub. No.: WO2015/092515
PCT Pub. Date: Jun. 25, 2015

(65) Prior Publication Data
US 2017/0006731 A1    Jan. 5, 2017

(30) Foreign Application Priority Data
Dec. 18, 2013   (JP) ................................. 2013-261403

(51) Int. Cl.
*H05K 7/20*     (2006.01)
*H05K 7/14*     (2006.01)
(Continued)

(52) U.S. Cl.
CPC ......... *H05K 7/2089* (2013.01); *H05K 5/0008* (2013.01); *H05K 5/061* (2013.01); *H05K 7/1432* (2013.01); *H05K 7/20927* (2013.01)

(58) Field of Classification Search
CPC .... H05K 7/2089; H05K 5/0008; H05K 5/061; H05K 7/20927; H05K 7/1432
See application file for complete search history.

(56) References Cited

U.S. PATENT DOCUMENTS 7,542,318 B2 * 6/2009 Otsuka .................. H02M 7/003
                                                                    363/178
7,965,510 B2 * 6/2011 Suzuki ................... B60K 6/365
                                                                    165/80.4

(Continued)

FOREIGN PATENT DOCUMENTS

CN         101174799 A     5/2008
JP         2011-176928 A     9/2011
(Continued)

*Primary Examiner* — Robert J Hoffberg
*Assistant Examiner* — Matt Dhillon
(74) *Attorney, Agent, or Firm* — Sughrue Mion, PLLC

(57) ABSTRACT

An electronic device with a cooling function includes a cap nut, a case, a semiconductor unit, a second bus bar for external output, and a connecting bolt. The case includes a side wall and a bottom surface. The bottom surface of the case has a coolant passage and a recessed portion to receive the cap nut. The coolant passage is open to above and is generally U-shaped. The recessed portion is positioned in a position surrounded by the coolant passage and the side wall of the case, and the cap nut is received in the recessed portion. The semiconductor unit includes a first bus bar that extends from the semiconductor unit. The semiconductor unit is fixed to the case in a posture and position that closes off the coolant passage from above. The second bus bar passes through the side wall of the case. Inside the case, the connecting bolt passes through the first bus bar and the second bus bar and screws into the cap nut, and the cap nut and a head portion of the connecting bolt bring the first bus bar and the second bus bar into close contact.

3 Claims, 2 Drawing Sheets

(51) Int. Cl.
*H05K 5/00* (2006.01)
*H05K 5/06* (2006.01)

(56) References Cited

U.S. PATENT DOCUMENTS

| | | | |
|---|---|---|---|
| 2008/0130223 A1* | 6/2008 | Nakamura | H02M 7/003 361/689 |
| 2010/0025126 A1* | 2/2010 | Nakatsu | B60L 11/00 180/65.1 |
| 2010/0026090 A1* | 2/2010 | Nakatsu | H05K 7/20927 307/9.1 |
| 2010/0097765 A1* | 4/2010 | Suzuki | B60K 6/365 361/699 |
| 2011/0051371 A1* | 3/2011 | Azuma | B60K 6/445 361/699 |
| 2011/0188204 A1 | 8/2011 | Horiuchi et al. | |
| 2011/0235270 A1* | 9/2011 | Nakatsu | H02M 7/003 361/689 |
| 2011/0310585 A1* | 12/2011 | Suwa | H05K 7/20927 361/820 |
| 2012/0039039 A1* | 2/2012 | Nishikimi | H05K 7/20927 361/689 |
| 2013/0128643 A1* | 5/2013 | Shinohara | H05K 7/20927 363/131 |

FOREIGN PATENT DOCUMENTS

| | | |
|---|---|---|
| JP | 2011-177004 A | 9/2011 |
| JP | 2011-228351 A | 11/2011 |

* cited by examiner

ELECTRONIC DEVICE WITH COOLING FUNCTION

BACKGROUND OF THE INVENTION

1. Field of the Invention

The invention relates to an electronic device in which a semiconductor unit that generates heat when operating is housed in a case, and that is provided with a passage through which coolant that cools the semiconductor unit flows inside the case.

2. Description of Related Art

Technology in which an inverter or a DC-DC converter or the like is formed by a semiconductor unit combined with a semiconductor device is known. A semiconductor unit that forms an inverter or the like for a large amount of power generates heat when operating, and thus needs to be cooled. Japanese Patent Application Publication No. 2011-177004 (JP 2011-177004 A) describes technology that cools a semiconductor unit by fixing the semiconductor unit to a flow path forming body. A coolant passage with an open upper surface is formed in the flow path forming body, and when the semiconductor unit is fixed to the flow path forming body, the coolant passage is closed off by the semiconductor unit, and coolant flows while contacting the semiconductor unit. The semiconductor unit must be electrically connected to an external device such as an electric motor. With the technology described in JP 2011-177004 A, a terminal is fixed to the semiconductor unit. This terminal is connected to a semiconductor inside the semiconductor unit, and a bolt hole is formed in the terminal. A conductor that extends toward an external device is fixed to the terminal by screwing a bolt into this bolt hole.

With the technology described in JP 2011-177004 A, the semiconductor unit is exposed, and the terminal is also exposed. Because the terminal is exposed, a special design is not needed to fix the conductor that extends toward the external device to the terminal. The bolt simply need be screwed into the bolt hole. The semiconductor unit is preferably housed inside of the case to improve durability and reliability of the inverter and the like. When the semiconductor unit is housed in a case, a coolant passage must be provided inside the case. Also, a conductor that extends from inside to outside the case through a wall of the case (hereinafter, this conductor will be referred to as an "external output bus bar") is needed to connect the semiconductor unit to the external device, and this external output bus bar must be connected inside to the case to a conductor on the semiconductor unit side (hereinafter this conductor will be referred to as a "bus bar").

SUMMARY OF THE INVENTION

Various problems arise when a semiconductor unit is to be housed inside of a case. (1) Metal powder is generated when connecting the bus bar to the external output bus bar inside the case with a nut and bolt, and this metal powder may move around inside the case and create a short-circuit. (2) When fixing the semiconductor unit inside the case, the semiconductor unit is positioned based on the case. If even the external output bus bar is positioned based on the case, the positional relationship between, the semiconductor unit and the external output bus bar may be off due to manufacturing error or the like, so that when the bus bar is connected to the external output bus bar, bending stress or the like may be generated in one or both of the bus bar and the external output bus bar. In order to avoid this, the position of the external output bus bar must be determined based on the semiconductor unit, but the bus bar and the external output bus bar must be connected inside the case, so this is difficult to achieve. (3) The case needs to be small in size, and the space efficiency greatly varies depending on the positional relationship between the coolant passage, and the bus bar and the external output bus bar.

This specification describes technology that solves the aforementioned problems that occur when a semiconductor unit is housed inside a case.

The electronic device with a cooling function described in this specification includes a cap nut, a case, a semiconductor unit, a second bus bar for external output, and a connecting bolt. The case includes a side wall and a bottom surface. The bottom surface of the case has a coolant passage and a recessed portion to receive the cap nut. The coolant passage is open to above. The coolant passage is generally U-shaped. The recessed portion is positioned in a position surrounded by the coolant passage and the side wall of the case, and the cap nut is received in the recessed portion. The semiconductor unit includes a first bus bar that extends from the semiconductor unit. The semiconductor unit is fixed to the case in a posture and position that closes off the coolant passage from above. The second bus bar passes through the side wall of the case. Inside of the case, the connecting bolt passes through the first bus bar and the second bus bar and screws into the cap nut, and the cap nut and a head portion of the connecting bolt bring the first bus bar and the second bus bar into close contact.

Consequently, the operation described below is able to be obtained. (1) metal powder generated when the first bus bar and the second bus bar are connected by the bolt and the cap nut is stored inside the cap nut and will not move around inside the case. (2) In order to bring the first bus bar and the second bus bar into close contact by screwing the bolt into the awaiting cap nut in the case, the bus bar is positioned based on the semiconductor unit, so bending stress is not applied to one or both of the first bus bar and the second bus bar. (3) A connecting portion of the first bus bar and the second bus bar is arranged inside the generally U-shaped coolant passage. Space is used efficiency, so the case can be made small.

In the structure described above, an O-ring may be interposed between the bottom surface of the case and the semiconductor unit to improve airtightness. Also, the semiconductor unit may be fixed to the case by passing a fixing bolt through the semiconductor unit and screwing the fixing bolt into a threaded hole provided in the bottom surface of the case, and the O-ring may be compressed between the semiconductor unit and the case. In this case, the first bus bar and the second bus bar may be connected together by bringing the cap nut toward the head portion of the connecting bolt from the recessed portion for receiving the cap nut. In this case, the cap nut is able to be displaced, so bending stress and the like is able to be prevented from being applied to one or both of the first bus bar and the second bus bar when fixing the semiconductor unit inside the case. The semiconductor unit may be a single component. The coolant passage is able to be closed off by this component itself provided that a lower surface of the semiconductor unit has a shape that closes off the coolant passage. However, instead of this, the semiconductor unit that closes off the coolant passage may be formed by a semiconductor module, and a plate that is fixed to the semiconductor module.

The electronic device described above is highly reliably and durable because it inhibits metal powder from spreading around inside the case, as well as inhibits unnecessary stress from being applied to one or both of the first bus bar and the second bus bar. Moreover, the case is reduced in size. The details of the technology described in this specification, and further improvements thereof, will be further described in example embodiments of the invention.

BRIEF DESCRIPTION OF THE DRAWINGS

Features, advantages, and technical and industrial significance of exemplary embodiments of the invention will be described below, with reference to the accompanying drawings, in which like numerals denote like elements, and wherein.

DETAILED DESCRIPTION OF EMBODIMENTS

The main characteristics of the example embodiment described below will now be listed. The technical elements illustrated in the specification and the drawings display technical utility both alone and in various combinations. (Characteristic 1) An external output bus bar is a relay plate that connects a bus bar to a device-side conductor that is connected to an external device. (Characteristic 2) A through-hole through which a shaft portion of a connecting bolt passes is formed in the external output bus bar and the bus bar. (Characteristic 3) A through-hole through which a shaft portion of a fixing bolt passes is formed in a semiconductor module and a plate. (Characteristic 4) A cap nut has a polygon-shaped cross-section. (Characteristic 5) An opening through which the cap nut passes is formed in the plate. (Characteristic 6) Two sides that form an edge of the opening prohibit the cap nut from rotating. (Characteristic 7) The cap nut is received first, and then the plate is put on. An inclined guiding surface that guides the cap nut and changes the position of the plate is formed on a lower side of the edge of the opening formed in the plate. (Characteristic 8) The plate is put on first, and then the cap nut is received. An inclined guiding surface that guides the plate and changes the position of the cap nut is formed on an upper side of the edge of the opening formed in the plate. (Characteristic 9) The external output bus bar is set first, and then a semiconductor module is housed. (Characteristic 10) The semiconductor module is housed first, and then the external output bus bar is set. (Characteristic 11) A lower surface of the semiconductor module has a shape that closes off a coolant passage. The semiconductor module itself is a semiconductor unit that closes off the coolant passage.

Figure 1:
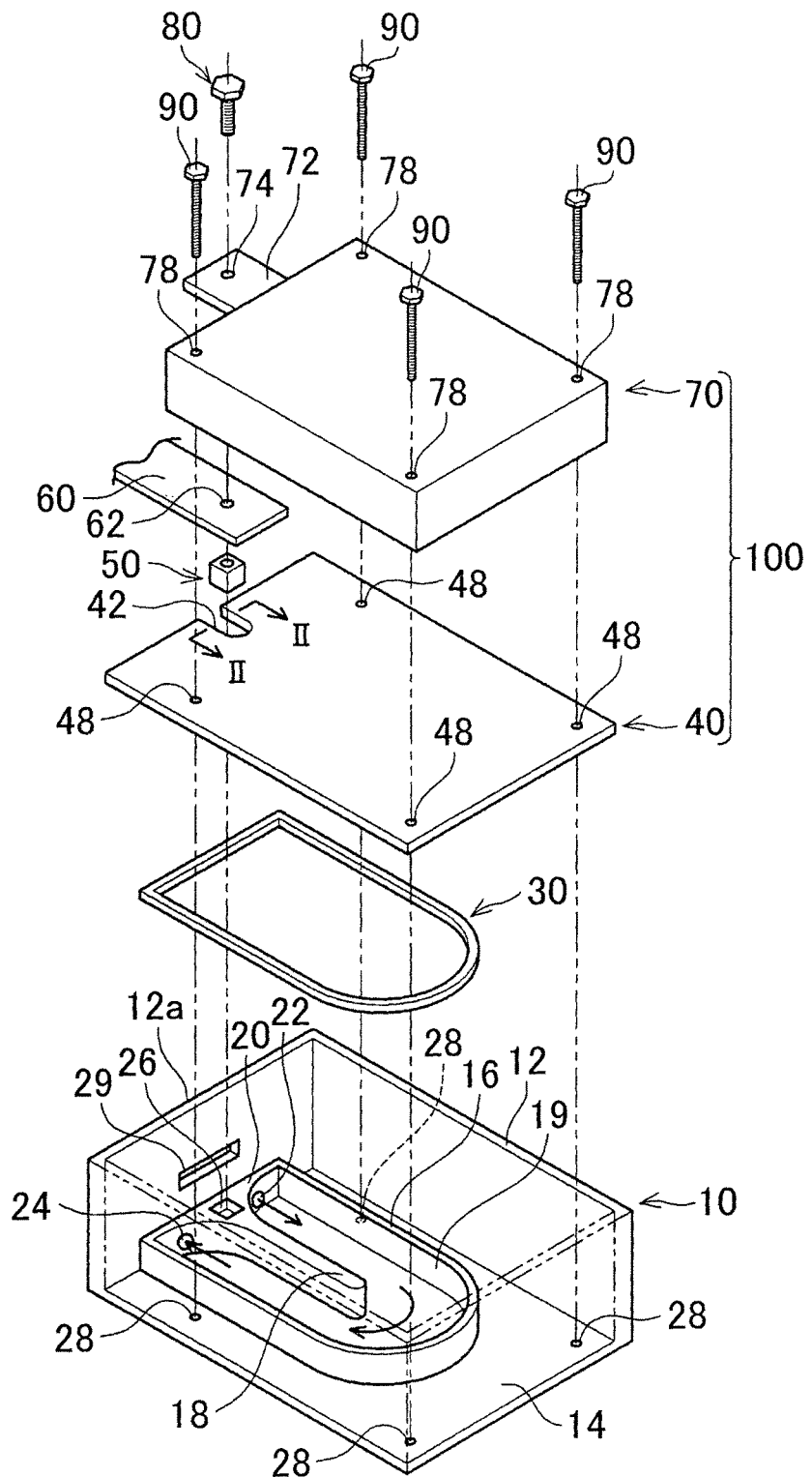
FIG. 1 is a partial sectional view of an electronic device according to one example embodiment of the invention.

FIG. 1. is a partial perspective view of an electronic device according to one example embodiment of the invention. The electronic device includes a case 10, an O-ring 30, a semiconductor unit 100, a cap nut 50, an external output bus bar 60, a connecting bolt 80, and a set of fixing bolts 90. The semiconductor unit 100 is formed by a combination of a plate 40 and a semiconductor module 70. In FIG. 1, the shapes of the parts are representative and shown simplified, but the actual shapes are complex.

The case 10 includes a generally rectangular bottom plate 14 and four side walls 12 that rise from the four sides. For clarity, the side wall on the left front side and the side wall on the right front side are not shown in FIG. 1. The case 10 is formed just large enough to house the plate 40 and the semiconductor module 70.

A flow path outer wall (a vertical wall) 16 that is generally U-shaped when viewed from above extends from the bottom plate 14. A flow path inner wall (a vertical wall) 18 extends on an axis of symmetry of the flow path outer wall 16. An end portion on the right side of the flow path inner wall 18 ends midway. A generally U-shaped coolant passage 19 is formed by the flow path outer wall 16, the flow path inner wall 18, and the bottom plate 14. An upper portion of the coolant passage 19 that is formed in the case 10 is open. An end portion on the left side of the flow path outer wall 16 and the flow path inner wall 18 is continuous with a side wall 12a on the left rear side. A base wall 20 that extends along the side wall 12a is formed between two points where the flow path outer wall 16 is continuous with the side wall 12a. An opening (an inlet) 22 for coolant inflow and, an opening (an outlet) 24 for coolant outflow are formed in the side wall 12a and the base wall 20. When coolant is fed in from the inlet 22 in a state in which the coolant passage 19 is closed off by the plate 40, which will be described later, the coolant flows through the coolant passage 19 and is discharged from the outlet 24, as shown by the arrows. A groove that receives an O-ring that will be described later is formed in an upper surface of the flow path outer wall 16 and the base wall 20.

A recessed portion 26 that receives the cap nut 50 is formed in a position surrounded by the side wall 12a and the generally U-shaped coolant passage 19, i.e., in a position where the flow path inner wall 18 contacts the base, wall 20. The recessed portion 26 is formed on an upper surface of a portion extending from the flow path inner wall 18 to the base wall 20. An opening 29 through which the external output bus bar 60 passes is formed at mid-height in the side wall 12a. Also, a set of threaded holes 28 that the set of fixing bolts 90 that fix the plate 40 and the semiconductor module 70 to the bottom plate 14 screw into are formed in the bottom plate 14.

Figure 2:
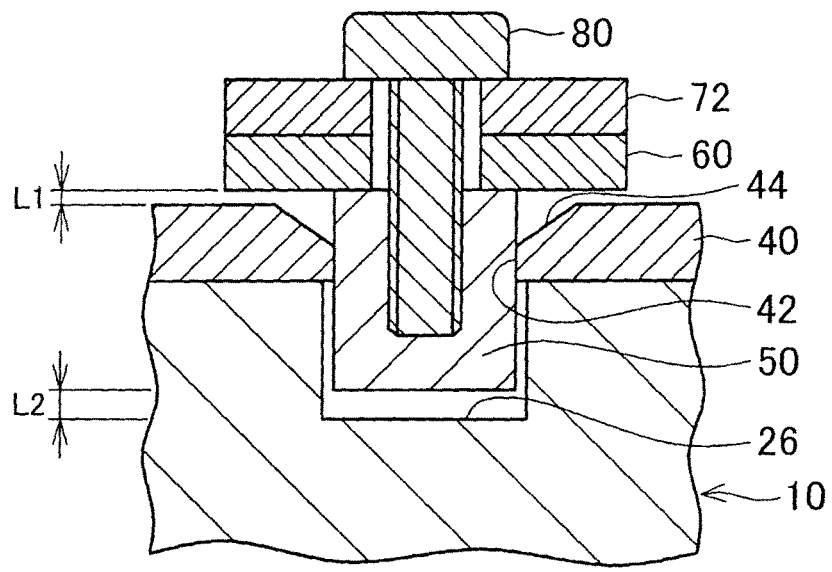
FIG. 2 is a sectional view of an area around a cap nut and a connecting bolt.

The O-ring 30 is placed along the O-ring receiving groove formed in the upper surface of the flow path outer wall 16 and the base wall 20, and then the plate 40 is placed on. An opening 42 through which the cap nut 50 passes is formed in the plate 40. Two sides that form an edge of the opening 42 extend substantially parallel and abut against an outer periphery of the cap nut 50 that has a polygon-shaped cross-section, thereby prohibiting the cap nut 50 from rotating. A set of through-holes 48 through which the set of fixing bolts 90 pass are formed in the plate 40. Once the plate 40 is in place, the cap nut 50 is then set. The cap nut 50 has a generally square cross-section and passes through the opening 42 after which it is received in the recessed portion 26 that is designed to receive the cap nut 50. As shown in FIG. 2, an inclined guiding surface 44 that guides the plate 40 and changes the position of the cap nut 50 is formed on an upper side of the edge that forms the opening 42 of the plate 40, which make facilitates the setting of the cap nut 50.

Once the cap nut 50 is set, the external output bus bar 60 is inserted into the opening 29 from outside the case 10, as shown in FIG. 1. The external output bus bar 60 passes through the side wall 12a of the case and extends from the inside to the outside of the case 10. The external output bus bar 60 may be a device-side conductor that is connected to an external device, or it may be a relay plate that connects a device-side conductor to a bus bar. A through-hole 62 through which a shaft portion of a connecting bolt 80 passes is formed in the external output bus bar 60.

Next, the semiconductor module 70 is housed inside the case 10. A bus bar 72 that extends toward the side wall 12a extends from the semiconductor module 70. A through-hole 74 through which the shaft portion of the connecting bolt 80 passes is formed, in the bus bar 72. When the semiconductor module 70 is housed in the case 10, the through-hole 74 of the bus bar 72, the through-hole 62 of the external output bus bar 60, and the cap nut 50 received in the recessed portion 26 are adjusted to a positional relationship in which they are lined up in the same straight line. A set of through-holes 78 through which the set of fixing bolts 90 pass are formed in the semiconductor module 70.

In this state, the connecting bolt 80 is inserted into the through-hole 74 in the bus bar 72 and the through-hole 62 in the external output bus bar 60, and the connecting bolt 80 is rotated. Consequently, the connecting bolt 80 screws into the cap nut 50. The cap nut 50 is restricted by the plate 40 so as not to rotate.

Metal powder may be generated when the connecting bolt 80 is screwed into the cap nut 50. Therefore, when a nut having a threaded hole through it is used, the metal powder will spread around inside the case 10. When the metal powder spreads around inside the case 10, it may cause a short circuit. In this example embodiment, a cap nut is used, so metal powder generated when the bolt is screwed into the nut is stored inside the cap nut 50 and will not spread around inside the case 10. As a result, a short circuit or the like is prevented from occurring.

When the connecting bolt 80 is screwed into the cap nut 50, the external output bus bar 60 and the bus bar 72 are sandwiched between the cap nut 50 and a head portion of the connecting bolt 80. As a result, the bus bar 72 and the through-hole 62 are in close contact with one another, so the bus bar 72 and the external output bus bar 60 are electrically connected. FIG. 2 is a view showing the bus bar 72 and the external output bus bar 60 in close contact with one another, sandwiched between the cap nut 50 and the head portion of the connecting bolt 80. The external output bus bar 60 is positioned with respect to the bus bar 72. Bending stress is not applied to the bus bar 72 and the external output bus bar 60. As shown in FIG. 2, when the connecting bolt 80 is screwed into the cap nut 50, the cap nut 50 is lifted up, such that a gap L1 is established between the external output bus bar 60 and the plate 40, and a gap L2 forms between the cap nut 50 and the case 10. Then, even if the semiconductor module 70 or the bus bar 72 is displaced, bending stress will not be applied to the bus bar 72 or the external output bus bar 60. The bus bar 72 and the external output bus bar 60 are connected using a center portion of the generally U-shaped coolant passage 19. The center portion of the generally U-shaped coolant passage 19 is a region essential to form the coolant passage 19. No extra space is required for connecting the bus bar 72 and the external output bus bar 60 together, so the case 10 is able to be made as small as possible.

Once the bus bar 72 and the external output bus bar 60 are connected using the connecting bolt 80 and the cap nut 50, the set of fixing bolts 90 are inserted into the set of through-holes 78 formed in the semiconductor module 70 and the set of through-holes 48 formed in the plate 40, and screwed into the set of threaded holes 28 formed in the case 10. As a result, both the semiconductor module 70 and the plate 40 are fixed to the case 10 at the same time. Also, the O-ring 30 is compressed between the plate 40 and the case 10, so coolant flowing through the coolant passage 19 is able to be prevented from leaking out to the semiconductor module 70, side. At this stage, the open upper surface of the coolant passage 19 is closed off by the semiconductor unit 100, so the semiconductor unit 100 is fixed to the case 10 in a posture and position that closes off the coolant passage 19. When fixing the semiconductor module 70 to the case 10, the semiconductor module 70 or the semiconductor unit 100 changes position. The external output bus bar 60 is connected to the semiconductor module 70, so even if the semiconductor module 70 changes position, bending stress will not be applied to the bus bars 60 and 72. After this is finished, the case 10 is closed by fixing an upper case, not shown, thereto.

Figure 3:
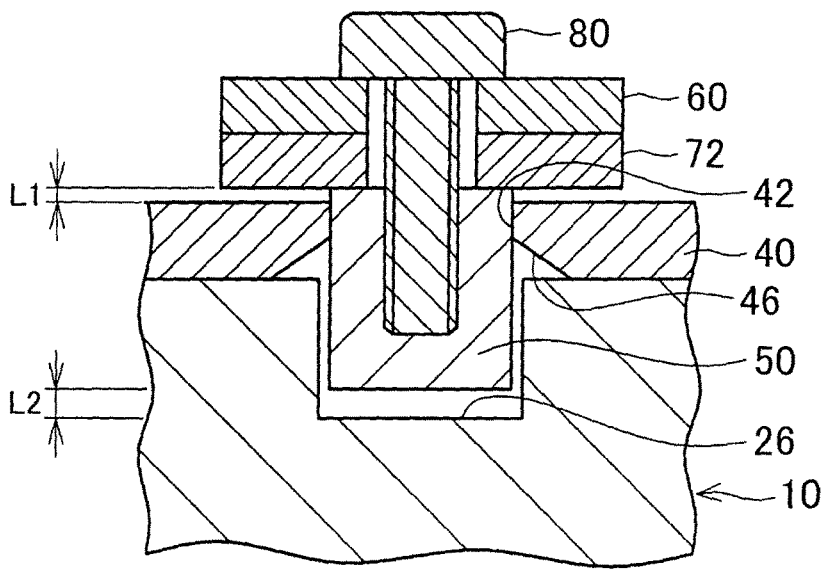
FIG. 3 is a view corresponding to FIG. 2 of a modified example.

Next, a modified example will be described. First, the cap nut 50 may be received in the recessed portion 26, and then the plate 40 may be placed on. In this case, an inclined guiding surface 46 that guides the cap nut 50 and changes the position of the plate 40 may be formed on a lower side of the edge that forms the opening 42 that is formed in the plate 40, as shown in FIG. 3. Also, the semiconductor module 70 may be housed first, and then the external output bus bar 60 may be inserted. In this case, the positional relationship of the external output bus bar 60 and the bus bar 72 may be such that the external output bus bar 60 overlaps with the bus bar 72, with the external output bus bar 60 being on top, as shown in FIG. 3. Also, the semiconductor module 70 and the plate 40 may be fixed to the case 10 first, and then the bus bar 72 may be connected to the external output bus bar 60. In this example embodiment, the opening 29 is used to enable the external output bus bar 60 to extend from the inside to the outside of the case 10. The area above the opening 29 may also be open. The external output bus bar 60 need simply extend from the inside to the outside of the case through the wall of the case, while the case 10 is closed by an upper case, not shown, being fixed thereto. In this example embodiment, a wall that defines the coolant passage is formed directly on the case bottom surface. However, instead of this, a member on which a wall that defines the coolant passage is formed may be fixed to a case main body. A case in which a wall that defines the coolant passage is formed on a bottom surface may be formed by fixing this member to the case main body. Also, in this example embodiment, the semiconductor unit 100 is formed by the plate 40 and the semiconductor module 70, but these may be integrated. The semiconductor unit 100 in which the plate 40 and the semiconductor module 70 are integrated is able to be obtained by having the shape of the bottom surface of the semiconductor module 70 be a shape that closes off the open upper surface of the coolant passage. Alternatively, the semiconductor unit 100 may be formed by joining the plate 40 to the semiconductor module 70 outside of the case 10, and this semiconductor unit 100 may be fixed to the case 10. In this example embodiment, the set of fixing bolts 90 pass through the semiconductor module 70 and the plate 40. The structure for fixing the semiconductor module 70 and the plate 40 to the case 10 may be modified in any one of a variety of ways.

Heretofore, specific examples of the invention have been described in detail, but these are merely examples, and the invention is not limited to these examples. The invention also includes various modifications of the specific examples described above. Also, the technical elements illustrated in the specification and the drawings display technical utility both alone and in various combinations. Further, the technology illustrated in the specification and the drawings simultaneously achieves a plurality of objects, and has technical utility by simply achieving one of these objects.

The invention claimed is:

1. An electronic device with a cooling function, the electronic device comprising:
  a cap nut;
  a case that includes a side wall and a bottom surface, the bottom surface of the case having a coolant passage and a recessed portion to receive the cap nut, the coolant passage being open to above, the coolant passage being generally U-shaped, the recessed portion being positioned in a position surrounded by the coolant passage and the side wall of the case, and the cap nut being received in the recessed portion;
  a semiconductor unit that includes a first bus bar that extends from the semiconductor unit, the semiconductor unit being fixed to the case in a posture and position that closes off the coolant passage from above;
  an second bus bar for external output, the second bus bar passing through the side wall of the case; and
  a connecting bolt that passes through the first bus bar and the second bus bar and screws into the cap nut inside of the case, and the cap nut and a head portion of the connecting bolt bringing the first bus bar and the second bus bar into close contact.

2. The electronic device according to claim 1, further comprising:
  an O-ring interposed between the bottom surface of the case and the semiconductor unit; and
  a fixing bolt that passes through the semiconductor unit, the fixing bolt screwing into a threaded hole provided in the bottom surface of the case, the semiconductor unit being fixed to the case by the fixing bolt,
  wherein the O-ring is compressed between the case and the semiconductor unit, and the cap nut is pulled toward the head portion of the connecting bolt from the recessed portion.

3. The electronic device according to claim 1, wherein the semiconductor unit includes a semiconductor module, and a plate that is fixed to the semiconductor module.

* * * * *